SEMICONDUCTOR BRIDGE RECTIFIER

Filed June 19, 1961

INVENTOR.
PAUL F. PARKS
BY
BUCKHORN, CHEATHAM & BLORE
ATTORNEYS

United States Patent Office 3,159,780
Patented Dec. 1, 1964

3,159,780
SEMICONDUCTOR BRIDGE RECTIFIER

Paul F. Parks, Hillsboro, Oreg., assignor to Tektronix, Inc., Beaverton, Oreg., a corporation of Oregon Filed June 19, 1961, Ser. No. 118,058
7 Claims. (Cl. 321—46)

The present invention relates generally to semi-conductor devices having a plurality of rectifying junctions therein and specifically includes a full wave bridge rectifier formed of semiconductor material having a plurality of matched PN junction diodes therein.

The semiconductor device of the present invention is particularly useful as a rectifying device to convert A.C. voltages to D.C. voltages in a simple but extremely accurate manner. Previous bridge rectifiers using semiconductor diodes have suffered from the disadvantage that each diode comprising an element of such bridge rectifier must be tested to make sure that it has rectifying characteristics which are substantially the same as the other semiconductor diodes forming such bridge rectifier. It is well known that when semiconductor diodes are subjected to heat the rectifying characteristics of such diodes vary according to temperature. This variation is caused by the fact that the resistance of the semiconductor diode decreases with increasing temperature above a threshold value and reverse bias or saturation current due to the flow of the minority carriers increases with such increasing temperature. This variation in rectifying characteristics also changes according to the concentrations of current carrier impurities in the semiconductor diodes so that no two separately formed diodes will have exactly the same rectifying characteristics. In order to form conventional bridge rectifiers consisting of a plurality of separate semiconductor diodes, it has previously been necessary to first test the rectifying characteristics of each diode over the range of useful temperatures so that such diodes are substantially matched over such temperature range.

The semiconductor device of the present invention overcomes the above discussed disadvantages of previous rectifying devices by utilizing a single piece of semiconductor material having a plurality of PN junction diodes formed therein. Since these diodes are formed in a single piece of semiconductor material, they have substantially the same rectifying characteristics which vary in a similar manner with the temperature of such single piece of semiconductor material. Therefore a bridge rectifier may be formed by the semiconductor device of the present invention to include a plurality of matched diodes which enable accurate rectification of voltages over a wide temperature range. This is possible because the concentration of current carrier impurities in an impurity doped region of semiconductor material is substantially uniform so that the PN junction formed by such region has similar properties along its length and separate portions of such junction have substantially the same rectifying characteristics. Thus the PN junction diodes provides by such junction portions are, in effect, matched during the formation of said PN junctions and do not require subsequent testing to determine whether they have similar rectifying characteristics.

Broadly the semiconductor device of the present invention includes a body of semiconductor material having at least one region of P-type conductivity and at least one region of N-type conductivity with a notch or hole in such body to divide one of such regions into two separate portions in order to form a pair of PN junction diodes having similar rectifying characteristics for each region so divided and a plurality of ohmic leads interconnecting the regions of P-type and N-type conductivity so that electrical current may flow through each PN junction in such body for efficient voltage rectification.

Therefore, one object of the present invention is to provide a semiconductor device in which a plurality of matched diodes having similar electrical characteristics form part of a unitary structure.

Another object of the present invention is to provide a rectifying device in which a body of semiconductor material contains a plurality of PN junction diodes with similar rectifying characteristics separated by notches in such body.

A further object of the invention is to provide a full wave bridge rectifier in which a pair of members of semiconductor material each have a PN junction therein and are notched to divide at least one of the regions forming such PN junction into two separate portions to form a pair of PN junction diodes in each of such members and in which a plurality of electrical contacts are employed between such members so that current may flow through each PN junction therein.

Still another object of the present invention is to provide a full wave bridge rectifier in which a single piece of semiconductor material having a plurality of regions of different electrical conductivity including at least two PN junctions separated by a region of intrinsic semiconductor material, is constructed with a hole or a plurality of notches in such piece to divide one of the regions forming each of said PN junctions into two separate portions in order to form at least four PN junctions diodes having similar rectifying characteristics.

Additional objects and advantages of the present invention will be apparent after referring to the following detailed description of various preferred embodiments thereof, and to the attached drawings of which:

Figure 1:
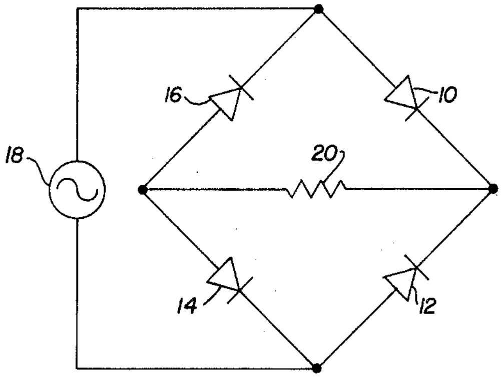
FIG. 1 is a schematic diagram showing a full wave bridge rectifier in accordance with the present invention.
Figure 2:
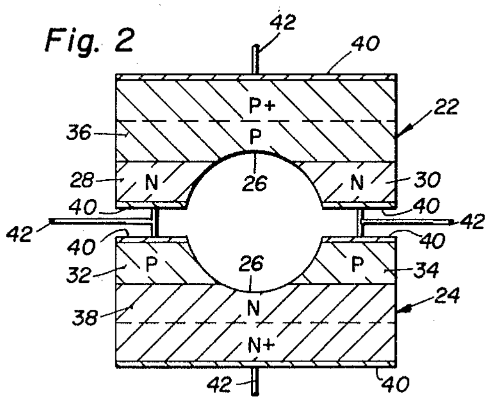
FIG. 2 is a diagrammatic sectional view of one embodiment of a bridge rectifier in accordance with the invention formed of two separate pieces of semiconductor material.

A full wave rectifier bridge using a plurality of semiconductor diodes for converting A.C. voltages to D.C. voltages is shown schematically in FIG. 1. This bridge rectifier may consist of four diodes 10, 12, 14 and 16 connected in a conventional manner to an A.C. voltage source 18 across a load impedance 20 to convert the A.C. voltage from source 18 to D.C. voltage across the load impedance 20. A bridge rectifier of the type shown in FIG. 1 made in accordance with one embodiment of the present invention is shown in FIG. 2 to include two separate members of single crystalline semi-conductor material 22 and 24, such as silicon, germanium or an intermetallic compound. Each member of semiconductor material may contain a plurality of P-type conductivity and N-type conductivity regions therein so as to have at least one PN junction therein. These PN junctions may be formed by conventional alloying or diffusion techniques using any common current carrier impurity, such as arsenic, antimony and phosphorous donor impurities and aluminum, boron, gallium and indium acceptor impurities. A portion of the material is removed from each semiconductor member 22 and 24 to provide a notch or hole 26 therein so that at least one P-type layer and one N-type layer in the different members is divided into two separate portions. This notch or hole 26 may be formed in any suitable manner, such as by chemically etching, mechanical sawing or the like, through the N-type layer of member 22 to produce N-type portions 28 and 30 and through the P-type layer of member 24 to provide P-type portions 32 and 34. These N-type portions 28 and 30 form two PN junction diodes with P-type region 36 of semiconductor member 22, while the P-type portions 32 and 34 form two PN junction diodes with the N-type region 38 of member 24. Ohmic contacts 40 are attached by conventional methods to the outer side surface of each P-type section and each N-type section forming the four P-N junction diodes and electrical leads 42 are secured to these contacts 40 so that the diodes are connected as a bridge rectifier. Either of the N-type layers and the P-type layers of members 22 and 24 may be provided with a resistivity gradient so that the part of the layer adjacent to the contacts 40 contains more current carrier impurities, as indicated by P+ and N+. This resistivity gradient increases the amount of reverse bias voltage which the PN junction diodes can take before breaking down and thus increases their usefulness as A.C. voltage rectifiers.

The bridge rectifier of FIG. 2 may be formed from two members of semiconductor material doped with donor and acceptor impurities, respectively, such as N-type and P-type silicon having a high resistivity between 50 and 100 ohms per centimeter. The member 22 of P-type silicon may be first heated in a phosphorous rich atmosphere to 1200° C. in order to provide an N-type coating of diffused phosphorous on the surface of the member and to form a PN junction in such member. The N-type coating is lapped from one surface of the P-type member 22 and, if a resistivity gradient is desired, such surface is then coated with P+ type material by heating such member in a boron atmosphere at about 1200° C. The P+ type coating is then removed from one surface of the remaining N-type coating and both of such coatings are removed from the remaining surfaces of member 22 by lapping or like machining to leave a layer of N-type material and a layer of P+ material on opposite surfaces of such member. Next, two layers of metal, such as nickel, are applied to the surfaces of the N-type layer and the P+ type layer by conventional methods after their oxide surfaces have been removed, to form ohmic contacts thereon. The N-type silicon member 24 is treated in a similar manner except that an N+ type layer is provided on the surface of the N-type member by the phosphorous coating and a P-type layer by the boron coating. After the ohmic contacts 40 have been applied, a portion of the N-type layer of member 22 and its overlying contact is removed by etching or the like to form notch 26 through said N-type layer and partially into P-type layer 36 in order to divide said N-type layer into portions 28 and 30. This notching step is also performed on member 24 to divide the P-type layer therein into separate portions 32 and 34. Lead wires 42 are then secured to the ohmic contacts 40 in a conventional manner in the positions shown. It should be noted that the semiconductor members 22 and 24 may be joined together into an integral bridge rectifier member by a common ohmic contact layer 40 between portions 28 and 32 and another such contact layer between portions 30 and 34 so that they form a single rigid member.

Figure 3:
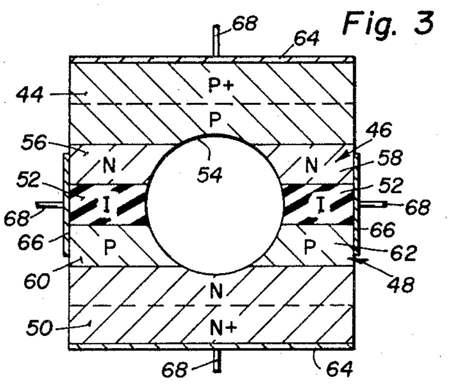
FIG. 3 is a diagrammatic sectional view of another embodiment of the bridge rectifier of the present invention formed of a single piece of semiconductor material.

Another embodiment of the bridge rectifier of the present invention is shown in FIG. 3. This semiconductor bridge rectifier is made from a single body of semiconductor material containing a plurality of regions of different electrical conductivity including a first P-type region 44 forming a PN junction with a first N-type region 46, a second P-type region 48 forming a PN junction with a second N-type region 50, and region of intrinsic semiconductor material 52 between the first N-type region 46 and the second P-type region 48. This intrinsic semiconductor material may be any such material substantially free of current carriers so that it is relatively nonconducting and effectively isolates the PN junctions discussed above. Intrinsic semiconductor material includes both "pure" semiconductor material having substantially no current carrier impurities therein and compensated semiconductor material having approximately equal amounts of P-type and N-type impurities therein. A hole 54 may be provided through the center of the semiconductor body by jet etching or the like. This hole 54 is positioned to divide the first N-type region 46, the second P-type region 48 and the intrinsic or I-type region 52 into two separate portions each. The portions 56 and 58 of the first N-type region 46 form two PN junction diodes with the first P-type region 44 and the P-type portions 60 and 62 form two PN junction diodes with second N-type region 50. Two large area ohmic contacts 64 are formed on the outer side surfaces of region 44 and region 50, while two other ohmic contacts 66 are provided on the outer end surfaces of regions 52, 56, 58, 60 and 62 to form common contacts between portions 56 and 60 and between portions 58 and 62. Electrical leads 68 are attached to ohmic contacts 64 and 66 in a conventional manner. It should be noted that while regions 44 and 50 are shown to have a resistivity gradient, P+ and N+ respectively, therein, this gradient can be eliminated altogether or provided in regions 56 and 60 if desired. This is true as to all embodiments of the invention.

Figure 4:
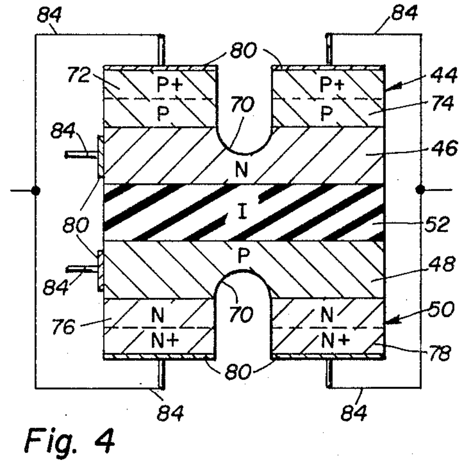
FIG. 4 is a diagrammatic sectional view of a further embodiment of the semiconductor bridge rectifier of the invention similar to FIG. 3.

FIG. 4 shows a third embodiment of bridge rectifier in accordance with the present invention, which is similar to that shown in FIG. 3 in that it may be made from a single body of semiconductor material having a plurality of regions of different electrical conductivity including an intrinsic semiconductor region 52. However, this embodiment differs from FIG. 3 in that the hole 54 has been replaced by a pair of slots or notches 70 in the sides of the semiconductor body through first P-type layer 44 and second N-type layer 50 to divide such layers into a pair of separate portions of P-type and N-type semiconductor material. Also the I-type region 52 may be made of insulator material, in which case the bridge would be formed of two separate members of semiconductor material. P-type portions 72 and 74 of region 44 each form PN junction diodes with first N-type region 46, while N-type portions 76 and 78 of second N-type region 50 form two PN junction diodes with P-type layer 48. The PN junction diodes so formed are interconnected by means of ohmic contacts 80 on the outer surfaces of portions 72, 74, 76 and 78 and on the outer end surfaces of first N-type region 46 and second P-type region 48 and electrical leads 84 attached to each of such ohmic contacts.

Figure 5:
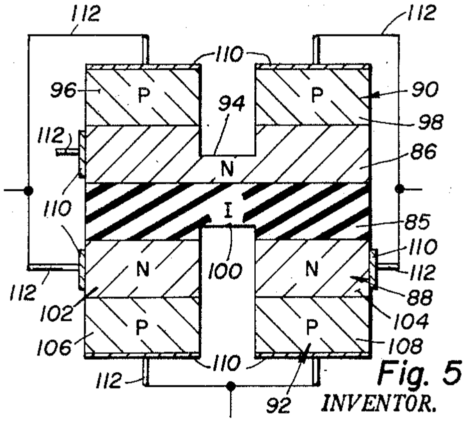
FIG. 5 is a diagrammatic sectional view of still another embodiment of a semiconductor bridge rectifier in accordance with the present invention.

Still another embodiment of a full wave rectifier bridge of the invention is shown in FIG. 5. This semiconductor bridge rectifier has the additional advantage that it can be made by fewer process steps than the other embodiments shown. Since the bridge is symmetrical about the intrinsic or I-type region 85, this I-type region may be provided by a body of intrinsic semiconductor material. Such body may be first coated on all sides with an N-type layer and then coated with a P-type layer. The N-type layers 86 and 88 are simultaneously formed on opposite sides of the intrinsic layer 85 in contact with such intrinsic layer. The P-type layers 90 and 92 are then simultaneously formed in contact with the exposed surfaces of N-type layers 86 and 88. These layers are separated by removing the coatings from the ends of the semiconductor body. A slot 94 is then cut, for example, by etching or sawing through layer 90 to divide such layer into two separate P-type portions 96 and 98 which form two PN junction diodes with N-type layer 86. A second deeper slot 100 is then cut through both P-type layer 92 and N-type layer 88 to divide layer 88 into two separate portions 102 and 104 and which also divides layer 92 into two separate portions 106 and 108 to form two more PN junction diodes. Ohmic contacts 110 are attached to the outer side surface of portions 96, 98, 106 and 108, and to the outer end surface of portions 102, 104 and layer 86, with lead wires 112 interconnecting said portions and said layers as a bridge rectifier in the manner shown. This embodiment also has the additional advantage in that the semiconductor material of N-type layers 86 and 88 may be substantially identical while the semiconductor material of P-type layers 90 and 92 may also be substantially identical since each pair of layers is formed simultaneously so that the four PN junction diodes produced by such layers may have similar rectifying characteristics over a wide temperature range.

It will be obvious to one having ordinary skill in the art that details of the above described preferred embodiments may be varied without departing from the spirit of the present invention. For example, arrangement of the notches or holes may be different, arrangement of the P-type, N-type and intrinsic layers may be changed, the semiconductor material from which the bridge rectifier is made may be varied and insulator material may be used in place of the intrinsic semiconductor material. Also the semiconductor device disclosed may be used for other purposes than as bridge rectifiers, for example, in switching circuits using a plurality of diodes. Therefore, it is not intended to limit the scope of the present invention to the above detailed description of preferred embodiments thereof, and that scope should only be determined by the following claims.

I claim:

1. A full wave rectifier having a plurality of matched semiconductor diodes comprising:

a body of semiconductor material having at least one region of P-type conductivity and at least one region of N-type conductivity with a resistivity gradient in at least one of said regions, said body being shaped with at least one notch therein to divide one of said regions into two separate portions in order to form a pair of PN junction diodes having similar rectifying characteristics for each region so divided, and a plurality of ohmic contacts connected to each of the conductive portions of said body in a manner so that electrical current may flow through each PN junction in said body in order to convert A.C. voltage into substantially D.C. voltage.

2. A full wave bridge rectifier containing a plurality of matched semiconductor diodes comprising:

a pair of members of semiconductor material each having a region of P-type conductivity and a region of N-type conductivity therein, said members being shaped with notches therein to divide at least one of said regions in each member into two separate portions to form at least four PN junction diodes in said pair of members having similar rectifying characteristics, and a plurality of electrical contacts attached to said members in order to connect said members together so that current may flow through each PN junction in said members for efficient rectification of A.C. voltages.

3. A full wave bridge rectifier containing a plurality of matched semiconductor diodes comprising:

a pair of members of single crystalline semiconductor material each having a region of P-type conductivity and a region of N-type conductivity therein, said members being shaped with a plurality of notches therein to divide at least one of said regions in each member into two separate portions to provide at least four PN junction diodes in said pair of members having similar rectifying characteristics, and a plurality of ohmic contacts attached to said members including a pair of contacts each connected between a separate P-type portion of one member and a separate N-type portion of the other member so that current may flow through each PN junction in said members for efficient conversion of A.C. voltage to D.C. voltage.

4. A full wave bridge rectifier containing at least four matched semiconductor diodes comprising:

a pair of members of semiconductor material each having a region of P-type conductivity and a region of N-type conductivity, said members being shaped with a plurality of notches therein to divide at least one of said regions in each member into two separate portions to provide at least four PN junction diodes in said pair of members having similar rectifying characteristics, and a layer of conducting material attached as an ohmic contact between said members in order to connect the P-type region of one member to the N-type region of the other member so that current may flow through each PN junction in said members to enable accurate conversion of A.C. voltage to D.C. voltage.

5. A full wave bridge rectifier containing a plurality of matched semiconductor diodes comprising:

a single piece of semiconductor material having a plurality of regions of different electrical conductivity including a first P-type region in contact with a first N-type region, a second P-type region in contact with a second N-type region, and a relatively nonconducting region positioned between said first and second regions to insulate the PN junctions formed by said regions, said piece being shaped with a single hole therein to divide at least one of said first regions and at least one of said second regions into two separate portions in order to form at least four PN junction diodes having similar rectifying characteristics, and a plurality of ohmic contacts attached to said piece in order to connect said regions so that current may flow through each PN junction in said piece for efficient rectification of A.C. voltages.

6. A full wave bridge rectifier containing a plurality of matched semiconductor diodes comprising:

a single piece of semiconductor material having a plurality of regions of different electrical conductivity including a first P-type region forming a PN junction with a first N-type region, a second P-type region forming a PN junction with a second N-type region, and a substantially non-conducting region of intrinsic semiconductor material positioned between said first and second regions to separate said PN junctions formed by said regions, said piece being shaped with a plurality of notches therein to divide at least one of said first regions and at least one of said second regions into two separate portions in order to from at least four PN junction diodes having similar rectifying characteristics, and a plurality of ohmic leads attached to said piece in order to connect said regions so that current may flow through each PN junction in said piece for accurate conversion of A.C. voltage to D.C. voltage.

7. A full wave bridge rectifier containing a plurality of matched semiconductor diodes comprising:

an integral bridge member having a plurality of layers of different electrical conductivity including a first layer of P-type semiconductor material forming a first PN junction with a first layer of N-type semiconductor material, a second layer of P-type semiconductor material forming a second PN junction with a second layer of N-type semiconductor material, and a layer of material having different electrical conductivity positioned between said first P-type layer and said second N-type layer to prevent a PN junction from being formed between first and second layers, said bridge member being shaped with a hole therein to divide said first P-type layer and said second N-type layer into two separate portions each so that four PN junction diodes having similar rectifying characteristics are formed thereby.

References Cited in the file of this patent

UNITED STATES PATENTS

| | | |
|---|---|---|
| 2,597,000 | Hyde | May 20, 1952 |
| 2,655,625 | Burton | Oct. 13, 1953 |
| 2,656,493 | Conant | Oct. 20, 1953 |
| 2,667,607 | Robinson | Jan. 26, 1954 |